(12) United States Patent
Leong

(10) Patent No.: US 9,368,857 B2
(45) Date of Patent: *Jun. 14, 2016

(54) COMBINING SIGNAL POWER USING MAGNETIC COUPLING BETWEEN CONDUCTORS

(71) Applicant: Marvell World Trade LTD., Singapore (SG)

(72) Inventor: Poh Boon Leong, Cupertino, CA (US)

(73) Assignee: Marvell World Trade LTD., St. Michael (BB)

( * ) Notice: Subject to any disclaimer, the term of this patent is extended or adjusted under 35 U.S.C. 154(b) by 151 days.

This patent is subject to a terminal disclaimer.

(21) Appl. No.: 14/090,283

(22) Filed: Nov. 26, 2013

(65) Prior Publication Data

US 2014/0085165 A1 Mar. 27, 2014

Related U.S. Application Data

(63) Continuation of application No. 12/783,017, filed on May 19, 2010, now Pat. No. 8,594,594.

(60) Provisional application No. 61/179,592, filed on May 19, 2009.

(51) Int. Cl.
| | |
|---|---|
| *H04B 1/04* | (2006.01) |
| *H01P 11/00* | (2006.01) |
| *H01P 5/12* | (2006.01) |
| *H03F 3/24* | (2006.01) |
| *H03F 3/45* | (2006.01) |

(Continued)

(52) U.S. Cl.
CPC ............... *H01P 11/001* (2013.01); *H01P 5/12* (2013.01); *H01Q 23/00* (2013.01); *H03F 3/245* (2013.01); *H03F 3/45071* (2013.01); *H03F 3/45188* (2013.01); *H03F 3/604* (2013.01); *Y10T 29/49018* (2015.01); *Y10T 29/49195* (2015.01)

(58) Field of Classification Search
None
See application file for complete search history.

(56) References Cited

U.S. PATENT DOCUMENTS

| | | | |
|---|---|---|---|
| 4,097,708 | A | 6/1978 | Bickel |
| 4,371,845 | A | 2/1983 | Pitzalis, Jr. |
| 4,956,614 | A | 9/1990 | Baril |

(Continued)

FOREIGN PATENT DOCUMENTS

| | | |
|---|---|---|
| EP | 0700152 A1 | 3/1996 |
| JP | 59148405 | 8/1984 |

(Continued)

OTHER PUBLICATIONS

Aoki et al., "A Fully-Integrated 1.8-V, 2.8-W, 1.9-GHz, CMOS Power Amplifier", IEEE MTT-S Digest, 2003, Pasadena, CA.

(Continued)

*Primary Examiner* — Lana N Le

(57) ABSTRACT

A system including a plurality of amplifiers, a plurality of first transmission lines, and a plurality of second transmission lines. The plurality of first transmission lines have first ends respectively connected to outputs of the plurality of amplifiers and second ends connected to a reference potential. The plurality of second transmission lines have first ends connected to a conductor and second ends that are unconnected. Signals output by the plurality of amplifiers to the plurality of first transmission lines are respectively magnetically coupled to the plurality of second transmission lines.

20 Claims, 4 Drawing Sheets

(51) Int. Cl.
*H03F 3/60* (2006.01)
*H01Q 23/00* (2006.01)

(56) References Cited

U.S. PATENT DOCUMENTS

| | | | |
|---|---|---|---|
| 4,965,530 A | 10/1990 | Katz | |
| 5,497,137 A | 3/1996 | Fujiki | |
| 5,652,546 A | 7/1997 | Dent | |
| 6,310,408 B1 | 10/2001 | Hermann | |
| 6,389,269 B1 | 5/2002 | Nanni et al. | |
| 6,480,699 B1 | 11/2002 | Lovoi | |
| 6,839,356 B2 | 1/2005 | Barany et al. | |
| 7,358,815 B2 | 4/2008 | Fujii | |
| 7,468,640 B2 | 12/2008 | Nosaka | |
| 7,630,693 B2 | 12/2009 | Liu et al. | |
| 7,792,035 B2 | 9/2010 | Kim et al. | |
| 8,169,081 B1 | 5/2012 | Jergovic et al. | |
| 8,594,594 B2* | 11/2013 | Leong | H01P 5/12 455/127.1 |
| 9,065,163 B1* | 6/2015 | Wu | H01P 3/12 |
| 2003/0054861 A1* | 3/2003 | Skarby | H01Q 1/246 455/561 |
| 2006/0284698 A1 | 12/2006 | Vaisanen | |
| 2008/0013528 A1 | 1/2008 | Miller et al. | |
| 2008/0266020 A1 | 10/2008 | Nosaka | |
| 2009/0009241 A1 | 1/2009 | Park et al. | |
| 2009/0258617 A1 | 10/2009 | Yoshihara | |
| 2010/0081410 A1 | 4/2010 | Kaido et al. | |
| 2010/0327970 A1 | 12/2010 | Mohamadi | |
| 2013/0116016 A1 | 5/2013 | Rofougaran et al. | |
| 2013/0308502 A1 | 11/2013 | Rofougaran et al. | |
| 2015/0009079 A1* | 1/2015 | Bojer | H01Q 9/145 343/745 |

FOREIGN PATENT DOCUMENTS

| | | |
|---|---|---|
| JP | H03179808 A | 8/1991 |
| JP | H08237043 A | 9/1996 |
| JP | 2008278345 A | 11/2008 |
| KR | 20070001765 | 1/2007 |

OTHER PUBLICATIONS

International Preliminary Report on Patentability, PCT Application No. PCT/IB2010/000374, mailed Dec. 1, 2011.

Aoki, Ichiro; Kee, Scott D.; Rutledge, David B.; Hajimiri, Ali; "Fully Integrated CMOS Power Amplifier Design Using the Distributed Active-Transformer Architecture", IEEE Journal of Solid-State Circuits, vol. 37, No. 3; Mar. 2002; 14 Pages.

European Office Action for European Application No. 10 731 793.5, Aug. 8, 2014; 13 Pages.

Kim, Seungwoo; Lee, Kyungho; Lee, Jongwoo; Kim, Bumman; Kee, Scott D.; Aoki, Ichiro; Rutledge, David B.; "An Optimized Design of Distruted Active Transformer"; IEEE Transactions on Microwave Theory and Techniques; vol. 53, No. 1; Jan. 2005; 10 Pages.

Taiwanese Office Action dated Mar. 20, 2014 for Taiwanese Patent Application No. 099116054; 11 Pages.

Japanese Reasons for Rejection dated Apr. 15, 2014 for Japanese Patent Application No. 2012-511366; 4 Pages.

Japanese Decision of Rejection dated Dec. 9, 2014 for Japanese Patent Application No. 2012-511366; 3 Pages.

* cited by examiner

US 9,368,857 B2

COMBINING SIGNAL POWER USING MAGNETIC COUPLING BETWEEN CONDUCTORS

CROSS REFERENCE TO RELATED APPLICATIONS

This is a continuation of U.S. patent application Ser. No. 12/783,017 filed May 19, 2010 (now U.S. Pat. No. 8,594,594 Issued Nov. 26, 2013) which claims the benefit of priority from U.S. Provisional Application No. 61/179,592, filed May 19, 2009, the disclosure of which is incorporated herein by reference in its entirety.

BACKGROUND

The present disclosure relates to combining signals in electronic circuits.

Unless otherwise indicated herein, the approaches described in this section are not prior art to the claims in this application and are not admitted to be prior art by inclusion in this section.

Many electronic circuits process signals to perform a wide variety of functions. Signals in such electronic circuits typically comprise changing voltage and current values, where the voltage and current variations may represent information, for example. One limitation on many electronic systems is the amount of power the electronic system can generate to transmit voltage and current signals. For example, a wireless system may be required to transmit radio frequency ("RF") signals to an antenna at a minimum power level to ensure reception of the signal. However, the power output of electronic circuits in the system may be limited by such factors as supply voltage or supply current, for example.

For instance, as transistor sizes decrease, electronic circuits using such transistors are able to increase in speed and achieve higher frequency operation. However, as the transistor sizes decrease, the breakdown voltages also decrease, and the supply voltages must be reduced to ensure safe operation of the devices. Lower supply voltages, in turn, reduce the amount of power that can be generated by the transistors in such devices. In a wireless system, for example, lower supply voltages reduce the power available to drive an antenna. This, in turn, reduces the distance the wireless system can transmit RF signals.

SUMMARY

Embodiments of the present disclosure include techniques for combining signal power. One embodiment includes an apparatus comprising a plurality of power amplifiers, a plurality of first transmission lines, a plurality of second transmission lines, and a central conductive region. Each power amplifier has an input and an output. The outputs of the power amplifiers are electrically coupled to different first transmission lines. The central conductive region has a node coupled to an antenna terminal. The second transmission lines are coupled to a different output of the plurality of power amplifiers through respective first transmission lines, and each of the second transmission lines includes an end electrically coupled to the central conductive region. Each power amplifier receives an input signal and produces an output signal, and the output signals of the power amplifiers are magnetically coupled from the first transmission lines to the second transmission lines and added at the node of the central conductive region.

In one embodiment, the first transmission lines are configured to have a first impedance and the second transmission lines are configured to have a second impedance.

In one embodiment, each of the first transmission lines and each of the second transmission lines have an elongated shape, and the output of each power amplifier is electrically coupled to one or more first transmission lines configured in parallel with one of the second transmission lines.

In one embodiment, the output of each power amplifier is electrically coupled to one of the first transmission lines configured in parallel with one of the second transmission lines.

In one embodiment, the output of each power amplifier comprises a differential output, and the differential output of each power amplifier is electrically coupled to two of the first transmission lines configured in parallel with one of the second transmission lines.

In one embodiment, each power amplifier comprises a first power amplifier having a first differential output and a second power amplifier having a second differential output. A first output of the first differential output is electrically coupled to a first one of the first transmission lines configured in parallel with one of the second transmission lines. A first output of the second differential output is electrically coupled to a second one of the first transmission lines configured in parallel with one of the second transmission lines. A second output of the first differential output is coupled to a first end of a third transmission line, and a second output of the second differential output is coupled to a second end of the third transmission line. The third transmission line has a first portion configured in parallel with a first side of the second transmission line and a second portion configured in parallel with a second side, opposite the first side, of the second transmission line.

In one embodiment, the central conductive region is circular and the node is at a center of the circular central conductive region.

In one embodiment, each of the first transmission lines and second transmission lines are rectangular.

In one embodiment, the first transmission lines are arranged in parallel with the second transmission lines.

In one embodiment, the second transmission lines extend radially outward from the node.

In one embodiment, the second transmission lines are separated by equal angles around the node.

In one embodiment, the plurality of power amplifiers, the plurality of first transmission lines, the plurality of second transmission lines, and the central conductive region are on a single integrated circuit.

Another embodiment includes a wireless system comprising an antenna and embodiments of an apparatus described herein.

Another embodiment includes a method comprising amplifying power of a signal in a plurality of power amplifiers to produce a plurality of amplified signals, electrically coupling the amplified signals to a plurality of first transmission lines, where the plurality of amplified signals are electrically coupled to a different one or more of the first transmission lines, magnetically coupling the amplified signals from the plurality of first transmission lines to a plurality of second transmission lines, where each of the second transmission lines receives an amplified signal through respective first transmission lines, electrically coupling the amplified signals from each of the second transmission lines to a central conductive region to produce an added amplified signal, and electrically coupling the added amplified signal to an antenna terminal.

In one embodiment, the method further comprises transforming an impedance using the first transmission lines and second transmission lines.

In one embodiment, each of the first transmission lines and each of the second transmission lines have an elongated shape, and wherein each amplified signal is electrically coupled to one or more first transmission lines configured in parallel with one of the second transmission lines.

In one embodiment, each amplified signal is electrically coupled to one of the first transmission lines configured in parallel with one of the second transmission lines.

In one embodiment, each amplified signal comprises a differential amplified signal, and wherein each amplified signal is electrically coupled to two of the first transmission lines configured in parallel with one of the second transmission lines.

In one embodiment, each amplified signal comprises a first differential output signal and a second differential output signal, wherein a first component of the first differential output signal is electrically coupled to a first one of the first transmission lines configured in parallel with one of the second transmission lines, wherein a first component of the second differential output signal is electrically coupled to a second one of the first transmission lines configured in parallel with said one of the second transmission lines, and wherein a second component of the first differential output signal and a second component of the second differential output signal are coupled to opposite ends of a third transmission line having a first portion configured in parallel with a first side of said one of the second transmission lines and a second portion configured in parallel with a second side, opposite the first side, of said one of the second transmission lines.

The following detailed description and accompanying drawings provide a more thorough understanding of the nature and advantages of the present invention.

DETAILED DESCRIPTION

Described herein are techniques for combining signal power. In the following description, for purposes of explanation, numerous examples and specific details are set forth in order to provide a thorough understanding of particular embodiments. The circuits and methods disclosed herein may be used in a variety of electronic systems. Further, the circuits and methods described herein may be implemented on an integrated circuit (IC). Particular embodiments as defined by the claims may include some or all of the features in these examples alone or in combination with other features described below, and may further include modifications and equivalents of the features and concepts described herein.

Figure 1:
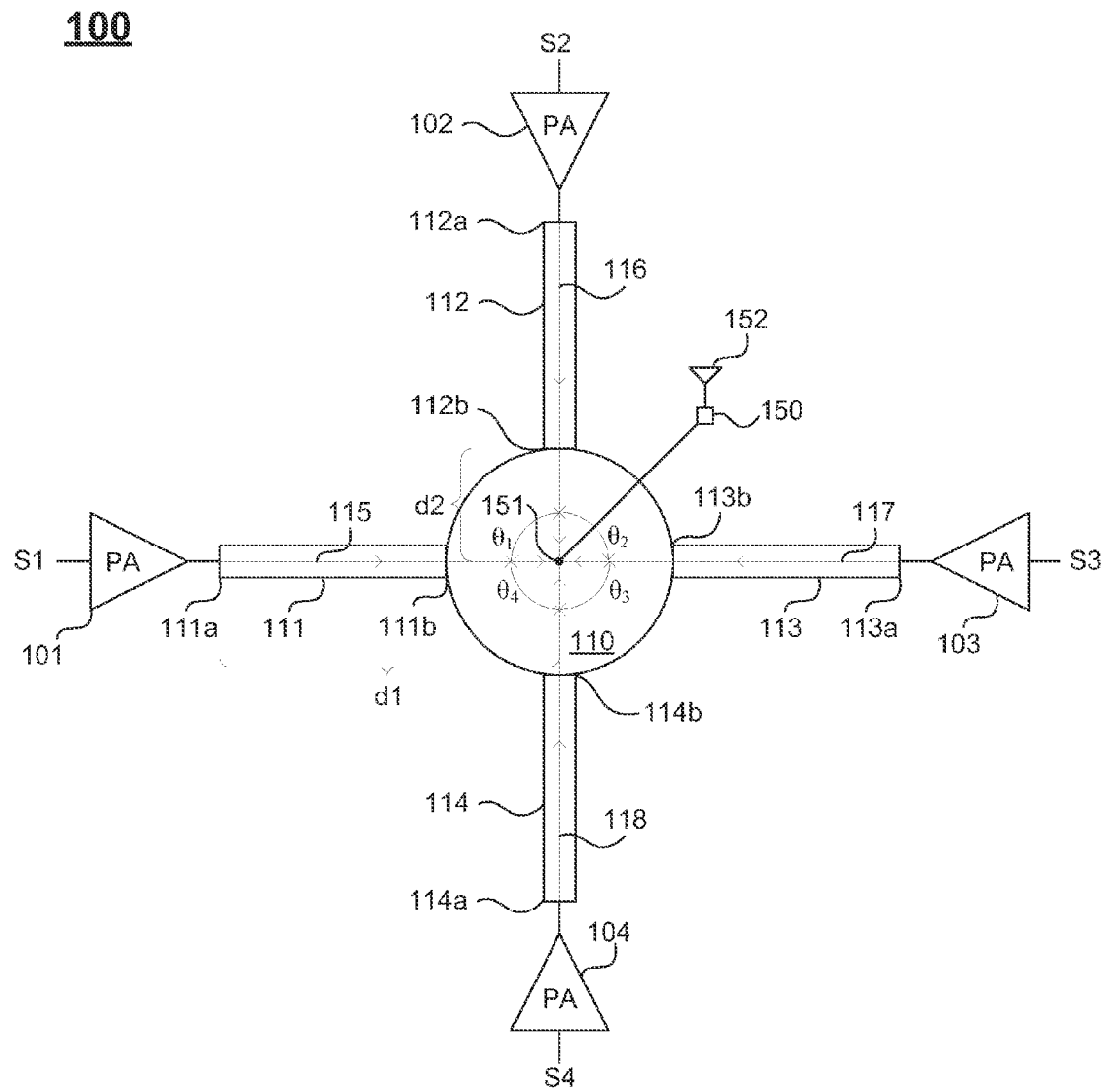
FIG. 1 illustrates a signal power combiner circuit according to one embodiment.

FIG. 1 illustrates a signal power combiner circuit 100 according to one embodiment. A radio frequency ("RF") system may generate signals S1-S4 to be transmitted on an antenna 152. Signal power combiner circuit 100 includes multiple power amplifiers 101-104 that receive signals S1-S4, respectively. For example, power amplifier 101 includes an input to receive input signal S1 and produces an output signal on an output of power amplifier 101. Similarly, power amplifier 102 includes an input to receive input signal S2 and produces an output signal on an output of power amplifier 102. Likewise, power amplifier 103 includes an input to receive input signal S3 and produces an output signal on an output of power amplifier 103. In this example, four (4) signals are being combined. Thus, power amplifier 104 includes an input to receive input signal S4 and produces an output signal on an output of power amplifier 104. Signals S1-S4 may be the same signal, for example, which is transmitted to antenna 152 using four different power amplifiers 101-104 and a combiner circuit to increase transmission power.

Signal power combiner circuit 100 includes transmission lines 111-114. Generally, transmission lines 111-114 have an elongated shape, such as a rectangle, with a first end and a second end. In this example, a first end of each transmission line 111-114 is coupled to a different output of the power amplifiers 101-104 and a second end of each transmission line 111-114 is electrically coupled to a central conductive region 110. Electrical coupling may be established by connecting conductive elements such as metallization or a conductive region of an integrated circuit, for example. As described in more detail below, output signals from each power amplifier 101-104 are magnetically coupled to corresponding transmission lines 111-114. Magnetic coupling may be established by using inductance to couple signals between conductive elements that are not connected by a conductor. For example, inductance of transmission lines may be used to magnetically couple signals from a first transmission line to a second transmission line if the second transmission line is within the magnetic field of a signal propagating in the first transmission line. Once the output signals are coupled to transmission lines 111-114, each output signal propagates toward central conductive region 110 where the signal power is added at a node 151. Node 151 of central conductive region 110 is coupled to an antenna terminal 150 (e.g., a pad or pin of an integrated circuit), and antenna terminal 150 may be coupled to an antenna 152 in a system application (e.g., a wireless system).

In this example, transmission line 111 includes a first end 111*a* coupled to an output of power amplifier 101. A second end 111*b* of transmission line 111 is electrically coupled to central conductive region 110. Similarly, transmission line 112 includes a first end 112*a* coupled to an output of power amplifier 102. A second end 112*b* of transmission line 112 is electrically coupled to central conductive region 110. Likewise, transmission line 113 includes a first end 113*a* coupled to an output of power amplifier 103. A second end 113*b* of transmission line 113 is electrically coupled to central conductive region 110. Finally, in this example, transmission line 114 includes a first end 114*a* coupled to an output of power amplifier 104. A second end 104*b* of transmission line 114 is electrically coupled to central conductive region 110.

In this example, central conductive region 110 is circular with node 151 at a center of the circular central conductive region. Furthermore, each transmission line 111-114 is rectangular and configured to extend radially outward from node 151. Each transmission line 111-114 is configured to form a path between the first ends 111*a*-114*a* and node 151. In this example, transmission lines 111-114 form straight line paths (illustrated by arrows 115, 116, 117, and 118) between each first end 111*a*-114*a* and node 151 such that the power of the output signals add at node 151. Accordingly, each first end 111a-114a is located an equal first distance, d1, from node 151 and each second end 111b-114b is located an equal second distance, d2, from node 151 so that the power amplifier output signals are added at node 151. As one example of implementation, transmission lines 111-114 and central conductive region 110 may be a single metallization pattern on a single semiconductor integrated circuit, and node 151 may be coupled to an antenna terminal using a via between metallization layers.

In this example, transmission lines 111-114 are separated by angles around node 151. For instance, transmission line 111 is separated from transmission line 112 by an angle $\theta_1$. Similarly, transmission line 112 is separated from transmission line 113 by an angle $\theta_2$. Likewise, transmission line 113 is separated from transmission line 114 by an angle $\theta_3$. Finally, in this example, transmission line 114 is separated from transmission line 111 by an angle $\theta_4$. Here, $\theta_1$, $\theta_2$, $\theta_3$, and $\theta_4$ are equal angles. Therefore, since central conductive region 110 is a circle in this example, the transmission lines 111-114 are distributed at equal distances apart from each other around the perimeter of central conductive region 110.

Figure 2:
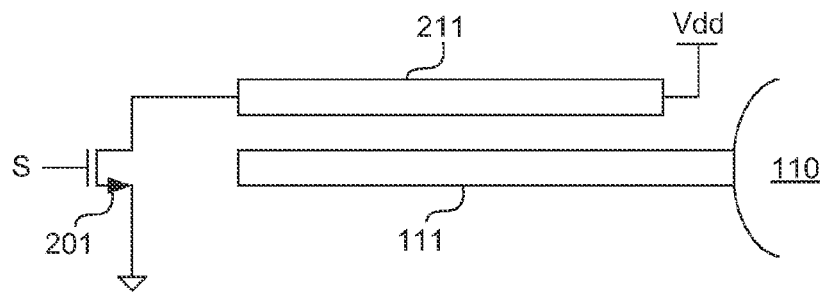
FIG. 2 illustrates magnetic coupling according to one embodiment.

FIG. 2 illustrates magnetic coupling according to one embodiment. Circuit 200 in FIG. 2 shows a power amplifier output stage including a transistor 201. In this example, transistor 201 is an NMOS transistor including a gate, a source, and a drain. The gate of transistor 201 receives a signal S. The source of transistor 201 is coupled to ground and the drain is coupled to one end of a transmission line 211. The opposite end of transmission line 211 is coupled to a supply voltage Vdd. Transmission line 211 is rectangular and configured in parallel with another transmission line 111. Transmission line 111 is electrically coupled to a central conductive region 110 as described above. Transmission lines 211 and 111 both include parasitic inductance. Transmission lines 211 and 111 are not physically in contact with each other, but are magnetically coupled to each other by the magnetic fields generated by the parasitic inductance. Transmission lines 211 and 111 may be metal lines separated by an oxide, for example. The amount of magnetic coupling is based, in part, on the distance between transmission lines 211 and 111. Thus, transmission lines 211 and 111 are positioned sufficiently close to each other to achieve a desired amount of magnetic coupling. The application of signal S at the gate of transistor 201 causes current to flow in transmission line 211. A change in current in transmission line 211, in turn, generates a magnetic field, which causes corresponding changes in current in transmission line 111. Accordingly, signal S is translated into a current and magnetically coupled from transmission line 211 to transmission line 111. The signal propagates down transmission line 111 into central conductive region 110 to node 151 as described above.

In one embodiment, transmission lines 211 and 111 may be configured to transform the impedance of the transmission line. For example, impedance may be a function of the length, width, and thickness of the transmission line. Transmission line 211 may be configured to have one impedance (e.g., 25 ohms) and transmission line 111 may be configured to have another impedance (e.g., 50 ohms).

Figure 3:
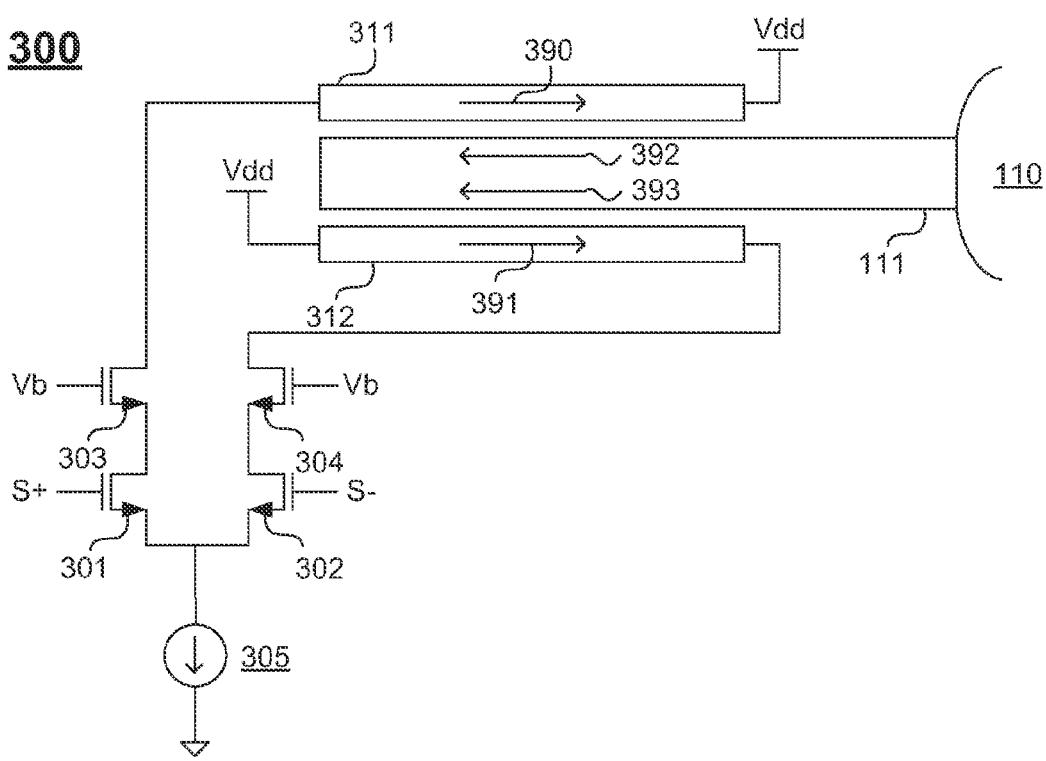
FIG. 3 illustrates magnetic coupling according to another embodiment.

FIG. 3 illustrates magnetic coupling according to another embodiment. In this example, a power amplifier includes a differential output as illustrated by circuit 300. Circuit 300 includes transistor 301 having a gate coupled to receive signal S+ and transistor 302 having a gate coupled to receive signal S−. Signals S+ and S− are components of a differential signal. Sources of transistors 301 and 302 are coupled through a bias current 305 to ground. A drain of transistor 301 is coupled to a source of cascode transistor 303 and a drain of transistor 302 is coupled to a source of cascode transistor 304. Gates of transistors 303 and 304 are coupled to bias voltage Vb and drains of transistors 303 and 304 are differential outputs of the power amplifier. In this example, the power amplifier is electrically coupled to two transmission lines 311 and 312 configured in parallel with transmission line 111. Each transmission line 311 and 312 is magnetically coupled to transmission line 111 as described above in FIG. 2. The drain of transistor 303 is coupled to a first end of transmission line 311 and the opposite end of transmission line 311 is coupled to supply voltage Vdd. Similarly, the drain of transistor 304 is coupled to a first end of transmission line 312 and the opposite end of transmission line 312 is coupled to supply voltage Vdd.

Since the signals on the drains of transistor 303 and 304 are differential, the drains are connected to opposite ends of the transmission lines 311 and 312, relative to transmission line 111, so that the signals are magnetically coupled to transmission line 111 constructively (e.g. so the currents do not cancel each other out). Specifically, the drain of transistor 303 is coupled to a first end of transmission line 311 that is adjacent to a terminal end of transmission line 111 that is farthest away from the central conductive region 110. A second end of transmission line 311 is adjacent to a side of transmission line 111 toward the central conductive region 110. A current 390 in transmission line 311 generates a magnetic field, which causes a corresponding current 392 having an opposite polarity to current 390. In order to generated a current 393 having the same polarity as current 392 (so the currents do not cancel), the drain of transistor 304 is coupled to an end of transmission line 312 that is adjacent to another side of transmission line 111 toward the central conductive region 110. A second end of transmission line 312 is adjacent to the terminal end of transmission line 111 that is farthest away from the central conductive region 110. In this example, transmission lines 303 and 304 are the same length to produce equal magnetic coupling from transmission lines 311 and 312 to transmission line 111.

Figure 4:
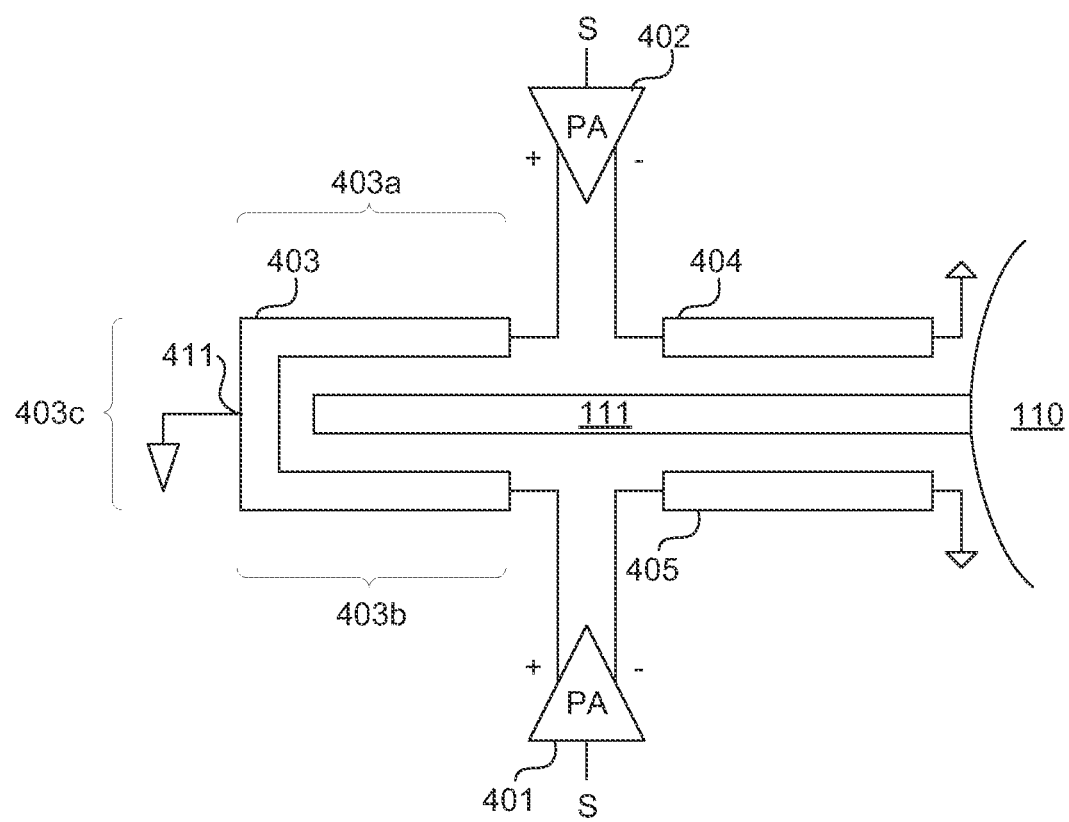
FIG. 4 illustrates magnetic coupling according to yet another embodiment.

FIG. 4 illustrates magnetic coupling according to yet another embodiment. As illustrated in circuit 400, two power amplifiers 401 and 402 having differential outputs are magnetically coupled to transmission line 111 and central conductive line 110. In this example, power amplifiers 401 and 402 receive signal S. Power amplifier 401 includes a positive output ("+") electrically coupled to transmission line 403 and a negative output ("−") electrically coupled to transmission line 405. Similarly, power amplifier 402 includes a positive output ("+") electrically coupled to transmission line 403 and a negative output ("−") electrically coupled to transmission line 404. Transmission lines 404 and 405 are rectangular in shape and configured in parallel with transmission line 111. One end of transmission line 404 is coupled to ground (e.g., virtual ground) adjacent to a first side of transmission line 111 and toward central conductive region 110. The opposite end of transmission line 404 is coupled to the negative output of power amplifier 402 farther away from the central conductive region 110 in the direction of the terminal end of transmission line 111. Similarly, one end of transmission line 405 is coupled to ground (e.g., virtual ground) adjacent to a second side of transmission line 111, opposite the first side, and toward central conductive region 110. The opposite end of transmission line 405 is coupled to the negative output of power amplifier 401 farther away from the central conductive region 110 in the direction of the terminal end of transmission line 111.

The positive outputs of power amplifiers 401 and 402 are electrically coupled to opposite ends transmission line 403.

Transmission line 403 is coupled to ground (e.g., virtual ground) at a midpoint 411. Transmission line 403 includes a portion 403a configured in parallel with the first side of transmission line 111. The portion 403a of transmission line 403 runs parallel to the first side of transmission line 111 to the terminal end of transmission line 111. Transmission line 403 includes another portion 403b configured in parallel with the second side of transmission line 111, opposite the first side. The portion 403b of transmission line 403 also runs parallel to the second side of transmission line 111 to the terminal end of transmission line 111. In this example, the first portion 403a and the second portion 403b are coupled together by a third portion 403c configured perpendicular to and around the terminal end of transmission line 111. Signals at the outputs of power amplifiers 401 and 402 are magnetically coupled from transmission lines 403-405 to transmission line 111 and propagate to a node in central conductive region 110.

While the above examples show transmission lines as parallel rectangular shapes, it is to be understood that other elongated shapes arranged adjacent to each other may be used to achieve magnetic coupling described above. Additionally, in some implementations, the power amplifiers, the transmission lines electrically coupled to the outputs of the power amplifiers, the central conductive region, and the transmission lines electrically coupled to the central conductive region are integrated on a single integrated circuit. A single integrated circuit may include a pad or pin coupled to an antenna for use in a wireless system, for example.

Figure 5:
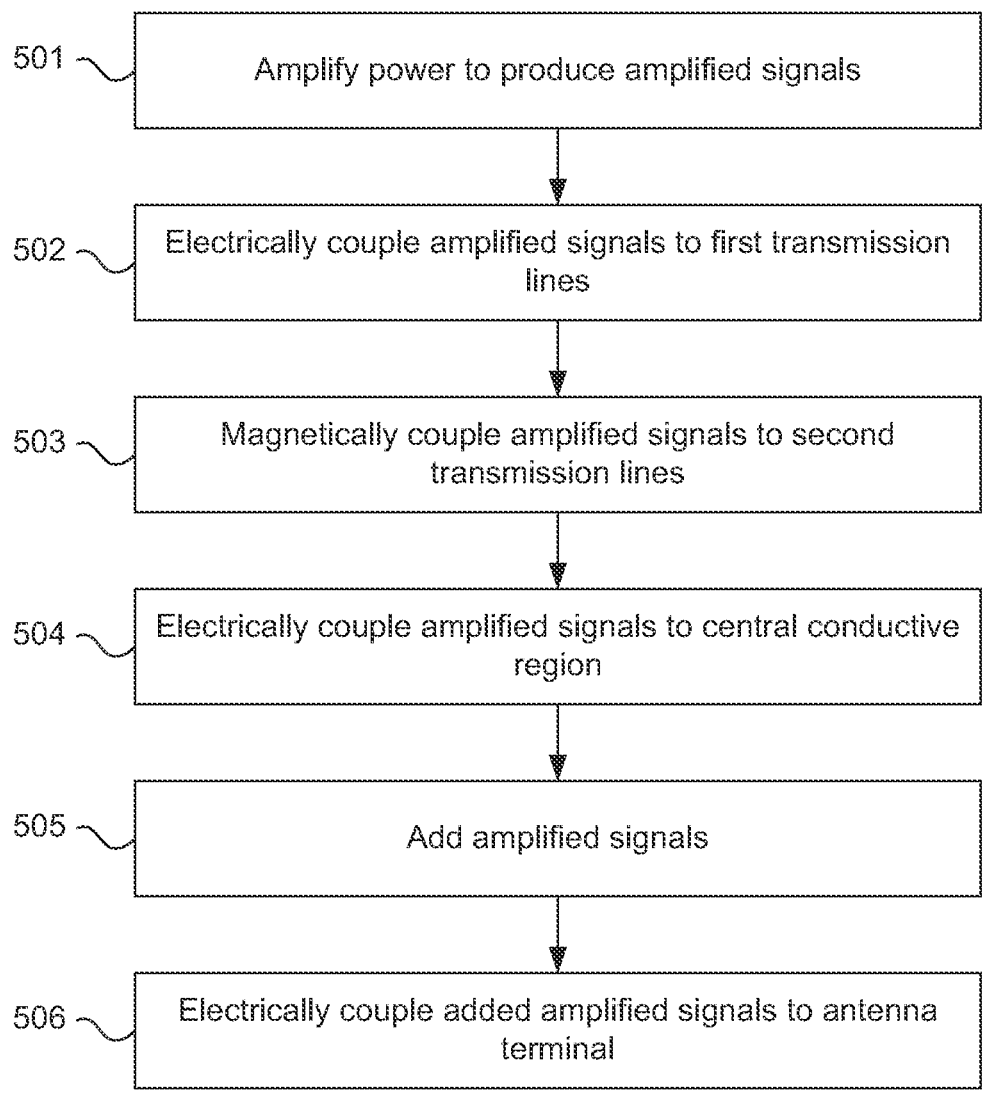
FIG. 5 illustrates a method of combining power according to one embodiment.

FIG. 5 illustrates a method of combining power according to one embodiment. At 501, power is amplified in a multiple power amplifiers to produce multiple amplified signals. At 502, the amplified signals are electrically coupled to first transmission lines. As described above, each amplified signal is electrically coupled to a different one or more first transmission lines. For example, with reference to FIG. 2, each amplified signal may be coupled to a single transmission line 211. As an alternative example, each amplified signal may be coupled to a multiple transmission lines 311-312 in FIG. 3 or transmission lines 403-405 in FIG. 4. At 503, the amplified signals are magnetically coupled from the first transmission lines to second transmission lines. Each of the second transmission lines receives a different amplified signal through the first transmission lines as in the examples described above. At 504, the amplified signals are electrically coupled from each of the second transmission lines to a central conductive region. At 505, the amplified signals are added at a node in the central conductive region to produce an added amplified signal. At 506, the added amplified signal is electrically coupled from the node in the central conductive region to an antenna terminal, which may be connected to an antenna in a wireless system, for example.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A system comprising:
a plurality of amplifiers;
a plurality of first transmission lines having first ends respectively connected to outputs of the plurality of amplifiers and second ends connected to a reference potential; and
a plurality of second transmission lines having first ends connected to a conductor and second ends that are unconnected,
wherein each of the plurality of second transmission lines is a single transmission line of length greater than each of the plurality of first transmission lines,
wherein the conductor is circular with a node at a center of the conductor to connect to an antenna, and
wherein signals output by the plurality of amplifiers to the plurality of first transmission lines are respectively magnetically coupled to the plurality of second transmission lines.

2. The system of claim 1, wherein the signals magnetically coupled to the plurality of second transmission lines are combined at the conductor.

3. The system of claim 2, further comprising:
the antenna coupled to the conductor,
wherein the signals combined at the conductor are output to the antenna.

4. The system of claim 1, wherein each of the plurality of first transmission lines is arranged parallel to a corresponding one of the plurality of second transmission lines.

5. The system of claim 1, wherein:
the plurality of amplifiers includes single-ended amplifiers, and
the reference potential is a supply voltage.

6. The system of claim 1, wherein:
the plurality of amplifiers includes differential amplifiers, and
the reference potential is a supply voltage.

7. The system of claim 6, wherein:
each of the plurality of first transmission lines includes a pair of transmission lines arranged on either side of a corresponding one of the plurality of second transmission lines,
outputs of each of the plurality of amplifiers are connected to a first pair of diagonally opposite ends of a corresponding pair of transmission lines, and
the reference potential is connected to a second pair of diagonally opposite ends of the corresponding pair of transmission lines.

8. The system of claim 1, wherein:
the reference potential is ground potential;
each of the plurality of amplifiers includes (i) a first differential amplifier having a first output of a first polarity and a second output of a second polarity, and (ii) a second differential amplifier having a first output of the first polarity and a second output of the second polarity; and
the first polarity is different than the second polarity.

9. The system of claim 8, wherein:
each of the plurality of first transmission lines is less in length than the plurality of second transmission lines,
each of the plurality of first transmission lines includes a pair of transmission lines arranged on either side of a corresponding one of the plurality of second transmission lines,
first ends of the pair of transmission lines near the conductor are connected to the reference potential, and second ends of the pair of transmission lines are respectively connected to the first outputs of the first and second differential amplifiers.

10. The system of claim 9, further comprising:
a plurality of third transmission lines including (i) a first portion, (ii) a second portion, and (iii) a third portion;
wherein the first and second portions are less in length than the plurality of second transmission lines and are arranged on either side of a corresponding one of the plurality of second transmission lines;
wherein first ends of the first and second portions close to the conductor are respectively connected to the second outputs of the first and second differential amplifiers;
wherein the third portion is arranged perpendicular to the first and second portions and is connected to second ends of the first and second portions; and
wherein the third transmission lines surround the unconnected ends of the corresponding ones of the plurality of second transmission lines.

11. A method comprising:
connecting first ends of a plurality of first transmission lines respectively to outputs of a plurality of amplifiers;
connecting second ends of the plurality of first transmission lines to a reference potential;
connecting first ends of a second plurality of transmission lines to a conductor, wherein second ends of the plurality of second transmission lines are unconnected, wherein each of the plurality of second transmission lines is a single transmission line of length greater than each of the plurality of first transmission lines, and wherein the conductor is circular with a node at a center of the conductor to connect to an antenna; and
magnetically coupling signals output by the plurality of amplifiers from the plurality of first transmission lines respectively to the plurality of second transmission lines.

12. The method of claim 11, further comprising combining the signals magnetically coupled to the plurality of second transmission lines at the conductor.

13. The method of claim 12, further comprising:
coupling the antenna to the conductor; and
outputting the signals combined at the conductor to the antenna.

14. The method of claim 11, further comprising arranging each of the plurality of first transmission lines parallel to a corresponding one of the plurality of second transmission lines.

15. The method of claim 11, wherein:
the plurality of amplifiers includes single-ended amplifiers, and
the reference potential is a supply voltage.

16. The method of claim 11, wherein:
the plurality of amplifiers includes differential amplifiers, and
the reference potential is a supply voltage.

17. The method of claim 16, wherein each of the plurality of first transmission lines includes a pair of transmission lines arranged on either side of a corresponding one of the plurality of second transmission lines, the method further comprising:
connecting outputs of each of the plurality of amplifiers to a first pair of diagonally opposite ends of a corresponding pair of transmission lines; and
connecting the reference potential to a second pair of diagonally opposite ends of the corresponding pair of transmission lines.

18. The method of claim 11, wherein:
the reference potential is ground potential; and
each of the plurality of amplifiers includes (i) a first differential amplifier having a first output of a first polarity and a second output of a second polarity, and (ii) a second differential amplifier having a first output of the first polarity and a second output of the second polarity,
wherein the first polarity is different than the second polarity.

19. The method of claim 18, wherein:
each of the plurality of first transmission lines is less in length than the plurality of second transmission lines, and
each of the plurality of first transmission lines includes a pair of transmission lines arranged on either side of a corresponding one of the plurality of second transmission lines,
the method further comprising
connecting first ends of the pair of transmission lines near the conductor to the reference potential, and
connecting second ends of the pair of transmission lines respectively to the first outputs of the first and second differential amplifiers.

20. The method of claim 19, further comprising:
surrounding the unconnected ends of the plurality of second transmission lines respectively by a plurality of third transmission lines including (i) a first portion, (ii) a second portion, and (iii) a third portion, wherein the first and second portions are less in length than the plurality of second transmission lines and are arranged on either side of a corresponding one of the plurality of second transmission lines;
connecting first ends of the first and second portions close to the conductor respectively to the second outputs of the first and second differential amplifiers;
arranging the third portion perpendicular to the first and second portions; and
connecting the third portion to second ends of the first and second portions.

* * * * *